(12) United States Patent
Lee et al.

(10) Patent No.: US 6,548,767 B1
(45) Date of Patent: Apr. 15, 2003

(54) MULTI-LAYER PRINTED CIRCUIT BOARD HAVING VIA HOLES FORMED FROM BOTH SIDES THEREOF

(75) Inventors: Kyu-Won Lee, Suwon (KR); Won-Jae Kim, Seoul (KR); Yong-Il Kim, Seoul (KR)

(73) Assignee: LG Electronics, Inc., Seoul (KR)

( * ) Notice: Subject to any disclaimer, the term of this patent is extended or adjusted under 35 U.S.C. 154(b) by 0 days.

(21) Appl. No.: 09/604,902

(22) Filed: Jun. 28, 2000

(30) Foreign Application Priority Data

Dec. 16, 1999 (KR) ............................................. 99-58176

(51) Int. Cl.[7] ................................................. H05K 1/11
(52) U.S. Cl. ...................... 174/262; 361/803; 361/792; 174/255
(58) Field of Search ................................. 174/262, 263, 174/266, 255, 264, 265; 361/803, 792, 793, 794, 795

(56) References Cited

U.S. PATENT DOCUMENTS

| | | | | |
|---|---|---|---|---|
| 4,642,160 A | * | 2/1987 | Burgess ........................ 216/18 |
| 5,229,647 A | * | 7/1993 | Gnadinger ................... 257/686 |
| 5,321,210 A | * | 6/1994 | Kimbara et al. ............. 174/256 |
| 5,347,712 A | * | 9/1994 | Yasuda et al. ............... 174/255 |
| 5,434,751 A | * | 7/1995 | Cole, Jr. et al. ............. 361/792 |
| 5,757,079 A | * | 5/1998 | McAllister et al. ............ 257/48 |
| 5,841,075 A | * | 11/1998 | Hanson ........................ 174/250 |
| 5,883,335 A | * | 3/1999 | Mizumoto et al. ........... 174/266 |
| 6,127,633 A | * | 10/2000 | Kinoshita ..................... 174/259 |
| 6,127,634 A | * | 10/2000 | Higashiguchi et al. ....... 174/262 |
| 6,166,438 A | * | 12/2000 | Davidson ..................... 257/700 |
| 6,204,456 B1 | * | 3/2001 | Lauffer et al. ............... 174/262 |
| 6,344,371 B2 | * | 2/2002 | Fischer et al. ............... 257/700 |

* cited by examiner

*Primary Examiner*—Albert W. Paladini
*Assistant Examiner*—Jose' H. Alcalá
(74) *Attorney, Agent, or Firm*—Birch, Stewart, Kolasch & Birch, LLP

(57) ABSTRACT

A multi-layer printed circuit board includes a core layer having a first circuit patterns formed on the upper and lower surface of a first insulation layer and via-holes in which a conductive layer is formed to electrically connect with the first circuit patterns. Built-up layers are formed on the upper and lower side of the core layer and have second circuit patterns electrically connected with the first circuit pattern by means of a via-holes in which conductive layers are formed to electrically connect the first circuit patterns of the core layer and the second circuit patterns of the upper and/or lower built-up layers. The via-holes in the core layer and the via-holes in the built-up layers are formed from an each side/both sides of the core layer and from the built-up layers toward the core layer, whereby interconnection of the circuit patterns is obtained without using through-holes and permitting shortening of the wiring and higher integration.

5 Claims, 5 Drawing Sheets

MULTI-LAYER PRINTED CIRCUIT BOARD HAVING VIA HOLES FORMED FROM BOTH SIDES THEREOF

BACKGROUND OF THE INVENTION

1. Field of the Invention

The present invention relates to a printed circuit board capable of improving an integration degree in mounting components and wiring by virtue of a core layer and built-up layers, and more particularly, to a multi-layer printed circuit board in which via-holes and conductive layers are formed on the core layer and on the built-up layers and the conductive layers are electrically connected, thereby improving an integration degree in mounting components and wiring of the printed circuit board as well as shortening the length of wiring.

2. Description of the Background Art

FIG. 1 is a sectional view showing a construction of a multi-layer printed circuit board in accordance with one conventional art.

As shown in the drawing, the multi-layer printed circuit board includes a copper thin film layer 11 formed between each insulation layer (insulating resin layer) 10, a through hole 12 formed to penetrate a predetermined portion of the copper thin film layer 11 and the insulation layer 10, and conductive layers 12-1 and 12-2 formed on the inner wall and the uppermost surface of the through hole 12 by electrodeless plating or electroplating. The through hole 12 is filled with an insulating resin.

The conductive layers 12-1 and 12-2 of the multi-layer printed circuit board are electrically connected with the copper thin film layer 11 formed between the insulation layers 10.

However, the problem is that the conductive layers, 12-1 and 12-2, which are connected with the copper thin film layers 11 formed between the insulation layers 10, are also connected with the copper thin film layer 11 that is not required to be connected.

In addition, the through hole 12 is normally formed by using a drill that is adjusted by a computer numerical control method. Currently, it is possible to form a hole having a diameter of 250 μm, but the integration in mounting components for a high concentration and high integrity is reduced.

Also, a land (not shown) having a diameter of 100 μm necessarily exists in the vicinity of the hole for connection with other mounted components, which inevitably leads to a reduction in mounting components and wiring.

Moreover, since the wiring in the circuit pattern formed on the uppermost and the lowermost surfaces is formed by detouring the circumference of the hole 12, the wiring of the circuit pattern is lengthened, and thus, a signal transmission is delayed and a noise occurs.

FIG. 2 is a sectional view showing a construction of a multi-layer printed circuit board in accordance with another conventional art.

As shown in the drawing, the multi-layer printed circuit board includes a first substrate 20A, a core substrate 20B and a second substrate 20C.

The first substrate 20A and the second substrate 20C have the same construction, thus, descriptions are made only for the first substrate 20A.

The first substrate 20A includes a copper thin film layer 22 formed between insulation layers (insulating resin layers) 23, a hole 27 formed to penetrate a predetermined portion of the copper thin film layer 22 and the insulation layer 23, and first conductive layers 24 and 26 formed on the inner wall and on the surface of the hole 27 by the electrodeless plating or electroplating.

The core substrate 20B is constructed by forming the copper thin film layers 20 on the upper and lower surface of the insulation layer 21. The core substrate 20B is attached between the first substrate 20A and the second substrate 20C. That is, after a resin 30 is, inserted between the first substrate 20A and the core substrate 20B and between the core substrate 20B and the second substrate 20C, when the substrates 20A, 20B and 20C are pressed by applying heat, the resin 30 is melted, filling the hole 27. And then as the resin 30 is hardened, the first substrate 20A and the second substrate 20C and the core substrate 20B are attached to each other.

Thereafter, the through hole 28 is formed penetrating predetermined portions of the substrates 20A, 20B and 20C, and second conductive layers 25 and 29 are formed on the inner wall and on the surface of the through hole 28 by the electrodeless plating or the electroplating. And then, a predetermined circuit pattern is formed on the uppermost and the lowermost surface of the substrate by a typical etching process.

In this conventional art, the second conductive layers 25 and 29 formed in the multi-layer printed circuit board are electrically connected with the copper thin film layers 20 and 22 formed between the insulation layers 23 and 30.

However, since there exists the through hole 28 on the first substrate 20A, the second substrate 20C and the core substrate 20B, the integration degree in mounting components and wiring are reduced.

In addition, since the wiring in the circuit pattern formed on the uppermost and the lowermost surfaces is formed by detouring the circumference of the hole 12, the wiring of the circuit pattern is lengthened, and thus, a signal transmission is delayed and a noise occurs.

Moreover, as the second conductive layer 25 is formed on the first conductive layer 24, the conductive layers formed on the upper and lower surface of the multilayer printed circuit board become thick. Thus, it is difficult to form a fine circuit pattern and its processes are complicated, resulting in a low productivity.

SUMMARY OF THE INVENTION

Therefore, an object of the present invention is to provide a multi-layer printed circuit board in which via-holes and conductive layers are formed on the core layer and on the built-up layers and the conducive layers are electrically connected, thereby improving the integration degree in mounting components and wiring of the printed circuit board as well as shortening the length of wiring.

To achieve these and other advantages and in accordance with the purposed of the present invention, as embodied and broadly described herein, there is provided a multi-layer printed circuit board including a core layer having a first circuit pattern formed on the upper surface of a first insulation layer and a first conductive layer formed on the lower surface of the first insulation layer; and built-up layers formed on the upper and lower surface of the core layer and having a second circuit pattern electrically connected with the first circuit pattern.

To achieve the above object, there is also provided a method for fabricating a multi-layer printed circuit board including the steps of: forming a core layer in a manner that a first circuit pattern is formed on the upper surface of the first insulation layer and a first conductive thin film and a first conductive layer are formed on the lower surface of the first insulation layer; and forming built-up layers in a manner that a second insulation layer on the upper and lower surface of the core layer and a second circuit pattern is formed on the surface of the second insulation layer.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
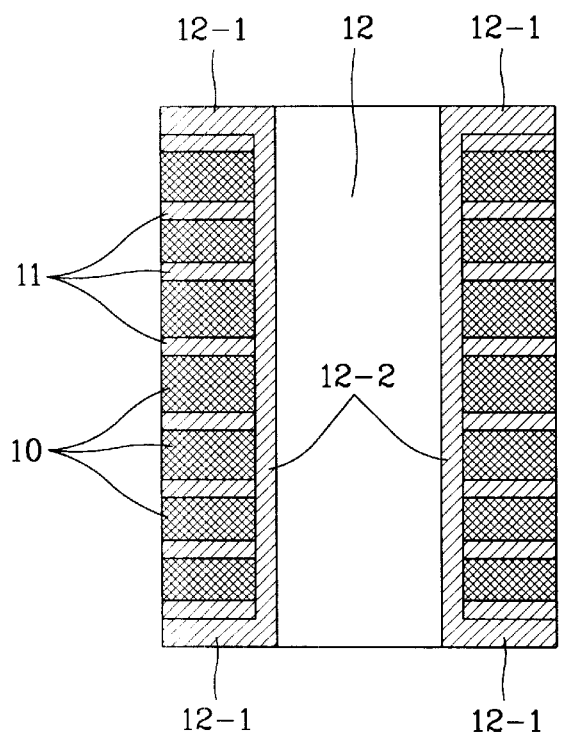
FIG. 1 is a sectional showing a construction of a multi-layer printed circuit board in accordance with one conventional art.
Figure 2:
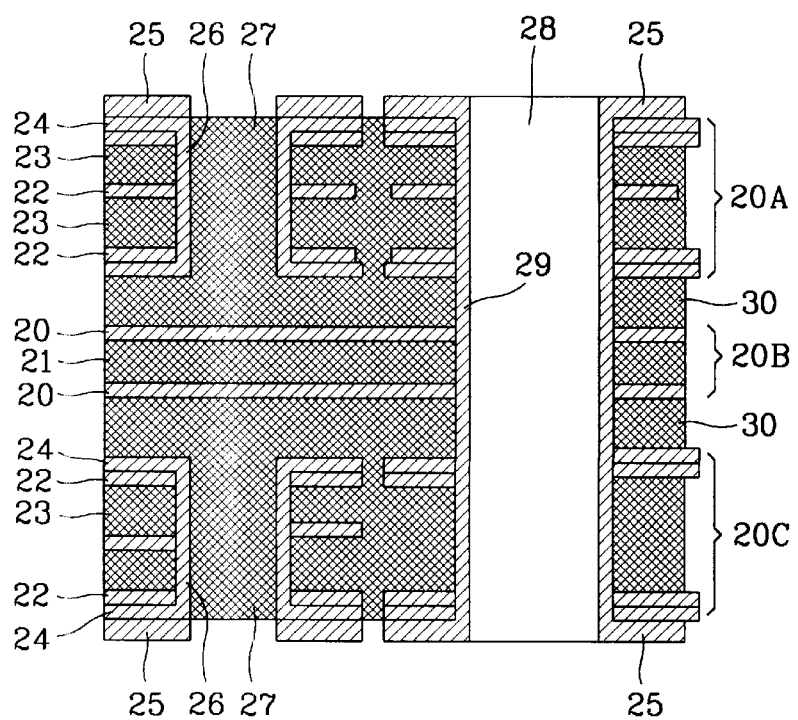
FIG. 2 is a sectional view showing a construction of a multi-layer printed circuit board in accordance with another conventional art.
Figure 3:
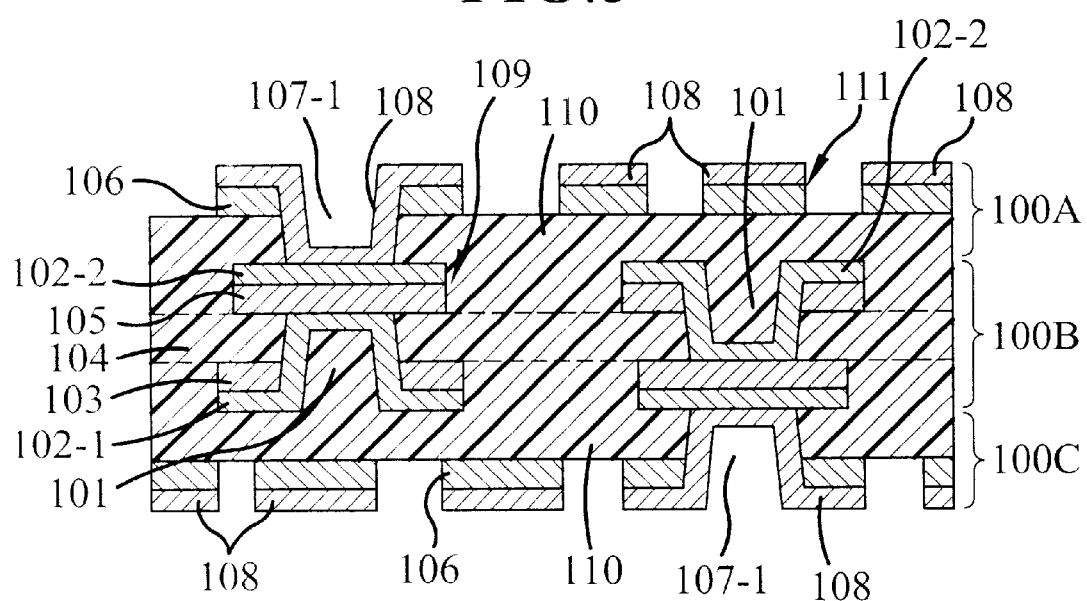
FIG. 3 is a sectional view showing a construction of a multi-layer printed circuit board in accordance with the present invention.

FIG. 3 is a sectional view showing a construction of a multi-layer printed circuit board in accordance with the present invention.

As shown in the drawing, the multi-layer printed circuit board includes a core layer 100B, a first built-up layer 100A and a second built-up layer 100C.

In detail, first, a first insulation layer 104 of the core layer 100B is formed. A first circuit pattern 109 is formed one the upper surface of the first insulation layer 104 and a first conductive thin film 103 is formed on the lower surface of the fist insulation layer 104.

As to the first circuit pattern 109, a via-hole 101 is formed on the surfaces of the first and the second conductive thin films 103 and 105 attached on the lower and upper surface of the first insulation layer 104 by a typical method by using a laser.

Thereafter, electrodeless plating and electroplating is performed on the upper and lower surface of the via-hole 101, so that the first and the second conductive thin films 103 and 105 are electrically connected to each other through the via-hole 101.

A first and a second conductive layers 102-1 and 102-2 are formed on the surfaces of the first and the second conductive thin films 103 and 105, and a typical etching process is performed to expose the insulation layer 104, thereby forming a circuit pattern. In this manner, the core layer 100B is formed.

Also, as shown in the drawing, core layer 100B is also symmetrically and reversely formed, having the same structure including the first conductive layer 102-1, the first conductive thin film 103 and the first circuit pattern 109, at the other side, with the same reference numerals, so that descriptions of which are omitted.

The first built-up layer 100A formed on the upper surface of the core layer 100B has the following construction.

A second insulation layer 110 of the first built-up layer 100A is formed, and a third conductive thin film 106 is formed on the upper surface of the second insulation layer 110.

Thereafter, a second via-hole 107-1 is formed penetrating predetermined portions of the third conductive thin film 106 and the second insulation layer 110 so as to expose a predetermined portion of the upper surface of the second conductive layer 102-2.

And then, the electrodeless plating or the electroplating is performed on the upper and lower surface of the second via-hole 107-1, so that the third conductive thin film 106 and the first and the second conductive layers 102-1 and 102-2 of the core layer 100b are electrically connected through the second via hole 107-1.

A third conductive layer 108 is formed on the inner wall and on the surface of the second via hole 107-1. And, at the same time, the third conductive layer 108 is also formed on the upper surface of the third conductive thin film 106.

The typical etching process is performed to expose the insulation layer 110, thereby forming a circuit pattern. That is, a plurality of second circuit patterns each consisting of the third conductive thin film 106 and the third conductive layer 108 are formed on the upper surface of the second insulation layer 110 with a predetermined portion of the second insulation layer 110 exposed.

The second built-up layer 100C, having the same construction as the first built-up layer 100A, is formed on the lower surface of the core-layer 100B. In this respect, the third conductive layer 108 of the second built-up layer 100C is formed to be electrically connected with the lower surface of the second conductive layer 102-2 in the reversely formed structure.

As the second built-up layer 100C has the same structure as that of the first built-up layer 100A, the same reference numerals are given, of which descriptions are omitted.

Figure 4:
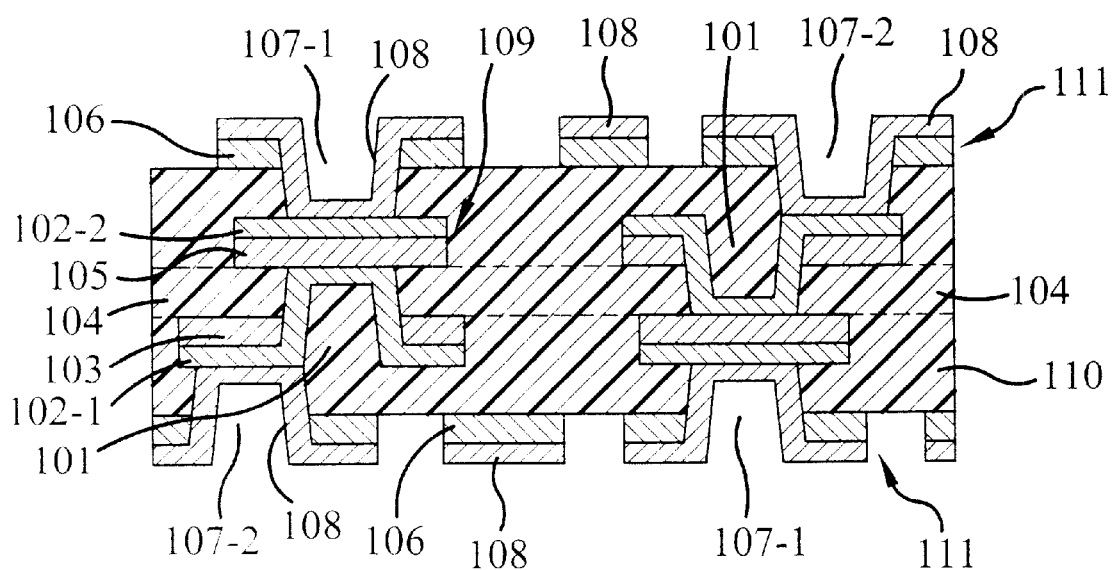
FIG. 4 is a sectional view showing an extended structure of the multi-layer printed circuit board of FIG. 3 in accordance with the present invention.

FIG. 4 is a sectional view showing an extended structure of the multi-layer printed circuit board of FIG. 3 in accordance with the present invention.

As shown in the drawing, a via-hole 107-2 is additionally formed at the right side of the first built-up layer 100A and at the left side of the second built-up layer 100C, so that the first built-up layer 100A is electrically connected with the second built-up layer 100C through the core layer 100B.

As the third via-hole 107-2 is formed in the same process forming the second via-hole 107-2, the same reference numerals are used as those in FIG. 3.

FIGS. 5A through 5I are views showing sequential processes of fabricating the extended structure of the multi-layer printed circuit board of FIG. 4.

Figure 5A:
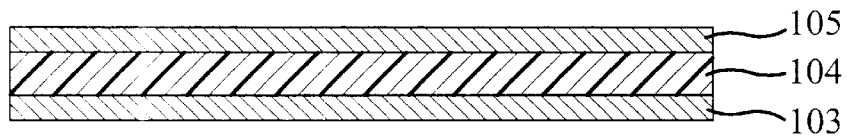
FIGS. 5A through 5I are views showing sequential processes of fabricating the extended structure of the multi-layer printed circuit board of FIG. 4.

First, as shown in FIG. 5A, a first conductive thin film 103 is formed on the lower surface of the first insulation layer 104, and a second conductive thin film 105 is formed on the upper surface of the first insulation layer 104. In this respect, a copper clad laminate (CCL) that the first and the second conductive thin films 103 and 105 are previously attached, may be used.

Thereafter, the surfaces of the first and the second conductive thin films 103 and 105 are evenly processed, on which a dry film is coated (not shown). And then, the dry film is removed by developing and exposing process. At this time, only the window portion 101A where the via hole is formed is removed.

Figure 5B:
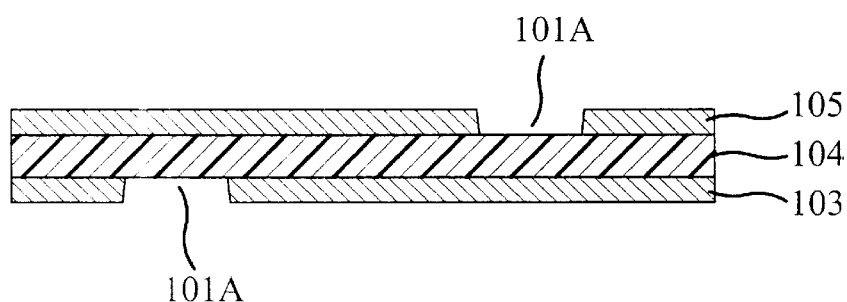

As shown in FIG. 5B, after the dry film is removed, the second conductive thin films 103 and 105 are etched to expose a predetermined portion of the first insulation layer 104 through the etching process. Then, the inner first insulation layer 104 is exposed at the window portion 101A.

Figure 5C:
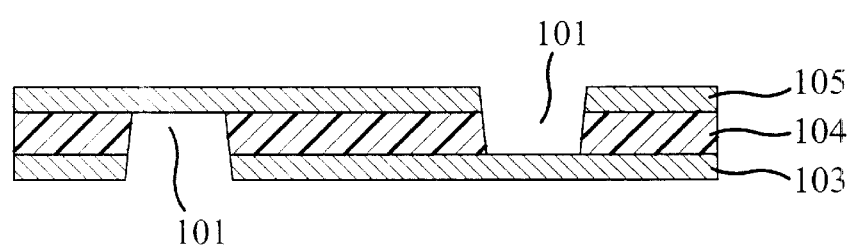

Then, as shown in FIG. 5C, the first insulation layer 104 exposed at the window portion 101A is removed by $CO_2$ laser or a plasma, to form a first via-hole 101.

Meanwhile, in case of using a Yttrium aluminum garnet (YAG) laser, since the conductive thin film and the insulation layer can be concurrently processed, the process of etching the first and the second conductive thin films 103 and 104 to expose the predetermined portion of the first insulation layer 104 through the etching process, to be followed by the process of removing the dry film, can be omitted, and the first via-hole 101 can be directly formed.

Thereafter, a desmearing process is performed to remove smear and carbide generated during the process of forming the first via-hole 101.

Figure 5D:
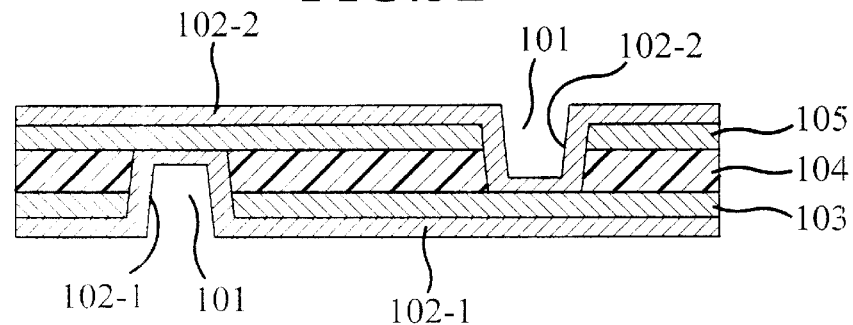

And then, as shown in FIG. 5D, the electrodeless plating or electroplating is formed on the upper and lower surface of the substrate, to thereby form a second conductive layer 102-2 on the inner wall of the first via-hole 101 and on the surface of the substrate. Accordingly, the second conductive layer 102-2 is also formed on the upper surface of the second conductive thin film 105. The first conductive layer 102-1 is formed on the lower surface of the first and the second conductive thin films 103 and 105 in the same manner as that of the process of forming the second conductive layer 102-2. By doing that, the first and the second conductive thin films 103 and 105 are electrically connected to each other.

Figure 5E:
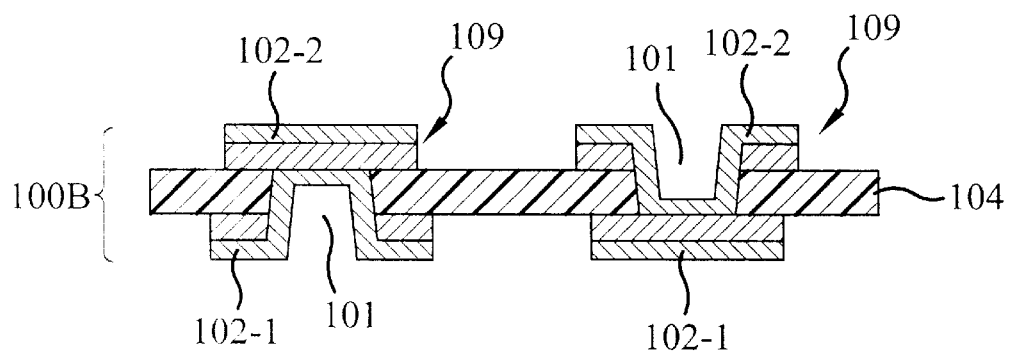

Subsequently, as shown in FIG. 5E, the surface of the second conductive layer 102-2 is evenly processed, on which the dry film is entirely coated. And then, the coated dry film is removed through developing and exposing process. In this respect, the coated dry film is removed except for the portion (not shown) thereof which is to be the first circuit pattern 109.

Thereafter, the first and the second conductive thin films 103 and 105 and the first and the second conductive layers 102-1 and 102-2 are partially etched to expose the portion of the first insulation layer 104 where the dry film was removed, and the portions of the first and the second thin films 103 and 105 and the first and the second conductive layers 102-1 and 102-2 that were not etched are oxidized through an oxygenate process to thereby enhance an adhesive force with respect to the second insulation layer 110, by which the core layer 100B is fabricated. FIGS. 5A through 5E are sectional views showing sequential processes of fabricating the core layer 100B.

FIGS. 5F through 5I are sectional views showing sequential processes of fabricating the first and the second built-up layers 100A and 100C. Since the first and the second build-up layers 100A and 100C have the same construction, the same reference numerals are given.

Figure 5F:
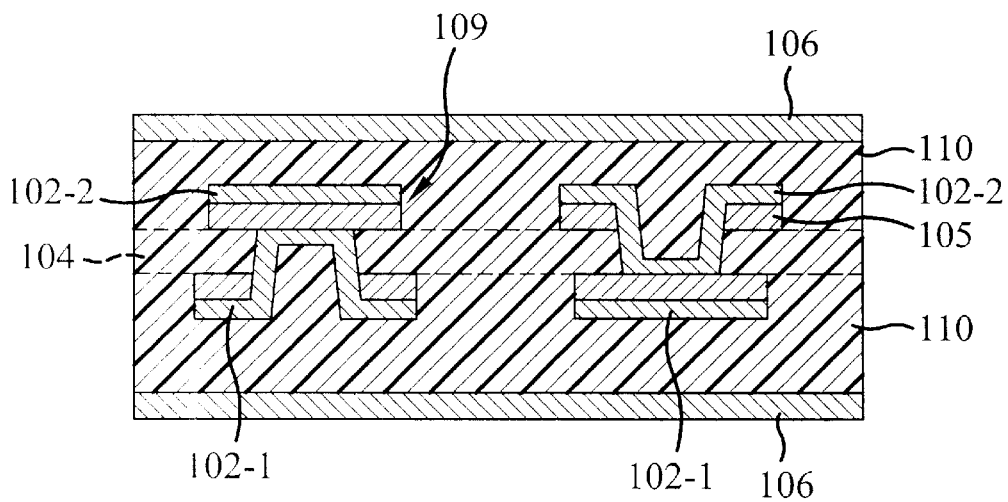

As shown in FIG. 5F, the second insulation layer 110 is formed on the lower surface of the core layer 100B, and a third conductive thin film 106 is formed on the surface of the second insulation layer 110.

The second insulation layer 110 and the third conductive thin film 106 can be formed by several methods as follows.

As a first method, insulating resin layers, each at one side of which a copper thin film is attached, are stacked on the both upper and lower surfaces of the core layer 100B, and then the second insulation layer and the third conductive thin film are formed by a stack-press method, by thermal laminating or by a printing method.

As a second method, the second insulation layer and the third conductive thin film are formed by using an insulating resin in a liquid or a solid state and a copper foil by the stack-press method, by the thermal laminating or by the printing method.

By adopting the first method or the second method, when the stack-press method, the thermal laminating or the printing method is performed, the stacked insulating resin layers are melted to be attached onto the first insulation layer 104 and onto the first and the second conductive layers 102-1 and 102-2 and filled inside the first via-hole 101. In this respect, the second insulation layer 110 and the third conductive thin film 106 may be formed only at one side of the core layer 100B.

Figure 5G:
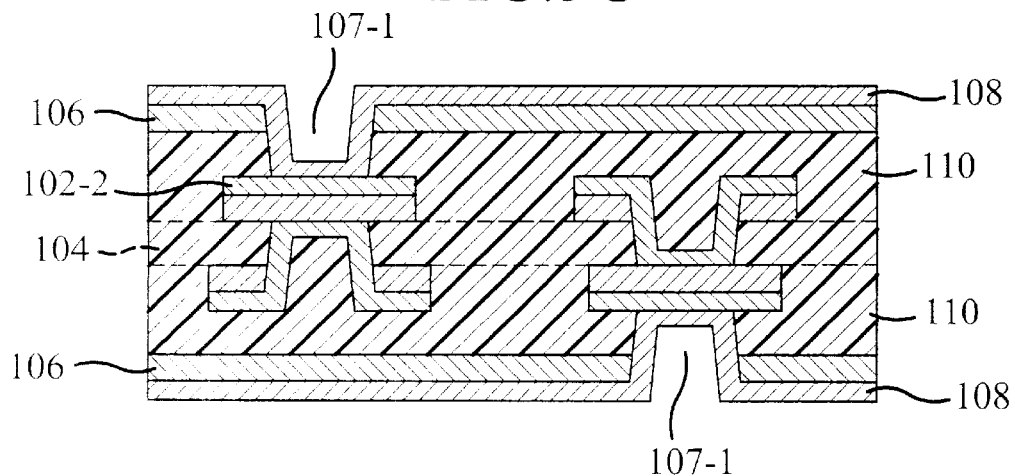

With reference to FIG. 5G, after the third conductive thin film 106 is removed through the etching process, the second insulation layer 110 and the third conductive thin film 106 are removed to expose a predetermined portion of the second conductive layer 102-2 by using the laser, thereby forming the second via-hole 107-1. And then, the third conductive layer 108 is formed on the surface of the third conductive thin film 106 and on the surface of the inner and outer wall of the second via-hole 107-1 by the electrodeless plating and electroplating method.

Meanwhile, in case of using the insulating resin layer with the copper thin film attached thereto, the dry film is coated on the surface of the copper thin film, and the portion of the coated dry film where the second via-hole is to be formed is removed by the developing process. And then, the copper thin film and the insulating resin layer are removed to expose the predetermined portion of the second conductive layer 102-2 by etching or by using the laser, thereby forming the second via-hole 107-1.

In addition, in case of using the insulating resin in a liquid state or in a solid state, it directly goes to the process of forming the second via-hole 107-1, while in case of using the YAG (Yttrium, aluminum garnet) laser, the third conductive thin film 106 and the third conductive layer 108 are simultaneously removed to thereby form the second via-hole 107-1.

Figure 5H:
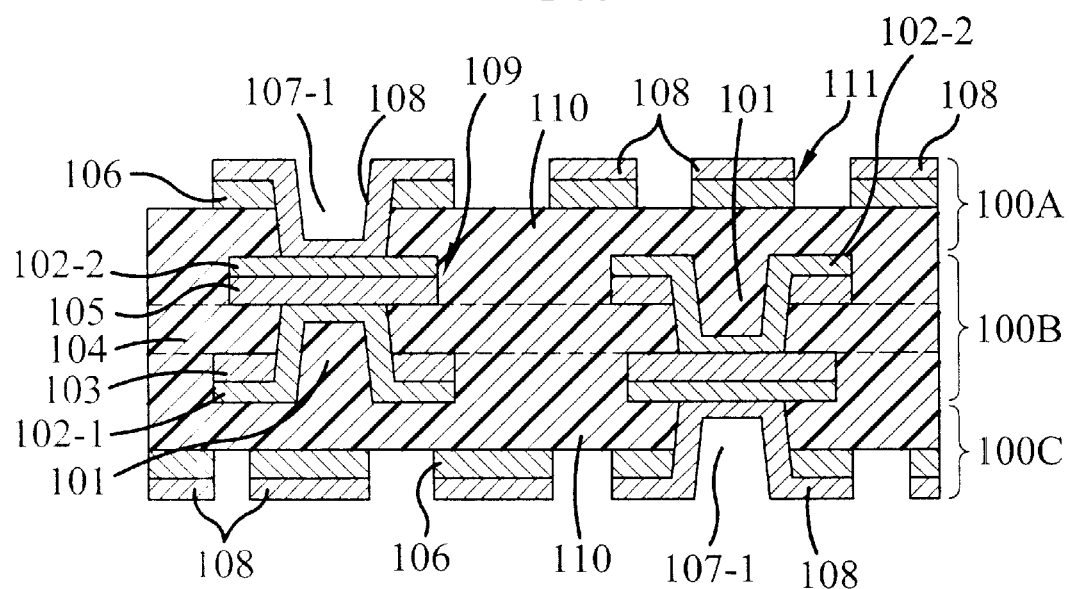

Thereafter, as shown in FIG. 5H, the third conductive thin film 106 and the third conductive layer 108 are etched so as to expose a plurality of predetermined portions of the second insulation layer 110, thereby forming a plurality of second circuit patterns 111.

In this respect, FIG. 5H is identical to FIG. 3, showing the same process of fabricating the multi-layer printed circuit board.

Figure 5I:
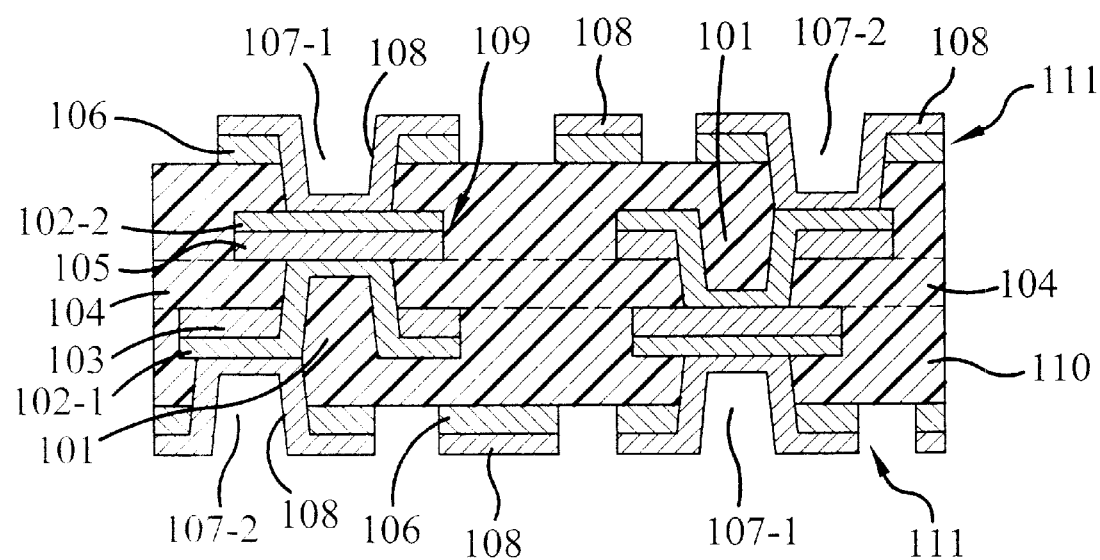

Subsequently, as shown in FIG. 5I, the third via-hole 107-2 is additionally formed so that the first built-up layer 100A formed on the upper surface of the core layer 100B and the second built-up layer 100C formed on the lower surface of the core layer 100B can be electrically connected to each other.

In this respect, the third via-hole 107-2 is formed in the same process as that of the second via-hole 107-1, and the third conductive layer 108 is also formed on the inner and outer wall of the third via-hole 107-2.

Accordingly, the third conductive layer 108 formed on the first built-up layer 100A and the third conductive layer 108 formed on the second built-up layer 100C are electrically connected to each other. In addition, a plurality of built-up layers may be formed on the surface of the first and the second built-up layers 100A and 100C.

As so far described, according to the multi-layer printed circuit board and its fabricating method of the present invention, unlike in the conventional arts in which the hole 27 is formed penetrating predetermined portions of the substrates 20A, 20B and 20C, the first built-up layer 100A is formed on the upper surface of the core layer 100B and the second built-up layer 100C is formed on the lower surface of the core layer 100B, which are then electrically connected, so that the integration degree in mounting components and wiring of the printed circuit board can be highly improved with an effect that the length of the wiring is shortened.

Also, as the length of the wiring is shortened, a high-speed signal transmission can be obtained.

In addition, by compacting and lighting the core layer, the first built-up layer and the second built-up layer, the process is simplified compared to that of the conventional arts.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such meets and bounds are therefore intended to be embraced by the appended claims.

What is claimed is:

1. A multi-layer printed circuit board having a plurality of stacked layers, comprising:

a core layer having first circuit patterns on an upper and a lower surface of a first insulation layer and a via-hole in which a first conductive layer is formed to electrically connect the first circuit patterns formed on the upper and lower surfaces of the insulation layer; and a built-up layer attached to the core layer, the built-up layer comprising a second insulation layer and second circuit patterns sequentially stacked on one side of the core layer, the second circuit patterns being on a surface of the built-up layer and a via-hole in which a second conductive layer electrically connects the second circuit patterns on the second insulation layer and the first circuit patterns of the core layer;

wherein the first circuit patterns on each side of the core layer are connected by via holes formed from opposite sides of the core layer toward the core layer, and the via-hole of the core layer and the via-hole of the built-up layer are formed to have an identical center.

2. The multi-layer printed circuit board according to claim 1, wherein the insulation layers of the core layer and the built-up layer are an insulation resin layer.

3. The multi-layer printed circuit board according to claim 1, wherein the conductive layers of the core layer and the built-up layer are copper.

4. The multi-layer printed circuit board according to claim 1, wherein each identical center has a symmetry in the core layer that is reverse to the symmetry of the next identical center.

5. The multi-layer printed circuit board according to claim 1, wherein the via-holes are tapered.

* * * * *